(12) United States Patent
Suh et al.

(10) Patent No.: US 11,125,615 B2
(45) Date of Patent: Sep. 21, 2021

(54) DATA OUTPUT DEVICE

(71) Applicant: SAMSUNG ELECTRONICS CO., LTD., Suwon-si (KR)

(72) Inventors: Yun Jae Suh, Suwon-si (KR); Sung Ho Kim, Yongin-si (KR); Jun Seok Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 103 days.

(21) Appl. No.: 16/540,724

(22) Filed: Aug. 14, 2019

(65) Prior Publication Data
US 2019/0368924 A1 Dec. 5, 2019

Related U.S. Application Data

(63) Continuation of application No. 15/436,108, filed on Feb. 17, 2017, now Pat. No. 10,401,217.

(30) Foreign Application Priority Data

Aug. 30, 2016 (KR) .................. 10-2016-0110492

(51) Int. Cl.
| G01J 1/44 | (2006.01) |
|---|---|
| H03F 3/45 | (2006.01) |
| G01J 1/02 | (2006.01) |
| G01J 1/18 | (2006.01) |

(52) U.S. Cl.
CPC .............. *G01J 1/44* (2013.01); *G01J 1/0238* (2013.01); *H03F 3/45071* (2013.01); *G01J 1/18* (2013.01); *G01J 2001/446* (2013.01)

(58) Field of Classification Search
CPC .... G01J 1/44; G01J 1/0238; G01J 1/18; G01J 2001/446; H03F 3/45071
See application file for complete search history.

(56) References Cited

U.S. PATENT DOCUMENTS

| 7,728,269 B2 | 6/2010 | Lichtsteiner et al. |
|---|---|---|
| 9,229,096 B2 | 1/2016 | Kim et al. |
| 2005/0117042 A1 | 6/2005 | Hirotsu et al. |

(Continued)

FOREIGN PATENT DOCUMENTS

| EP | 2717466 A1 | 4/2014 |
|---|---|---|
| JP | 3691050 B2 | 8/2005 |

(Continued)

OTHER PUBLICATIONS

Lichtsteiner, et al. "128 128 120 dB 15 μs Latency Asynchronous Temporal Contrast Vision Sensor", IEEE Journal of Solid-State Circuits, vol. 43, Issue No. 2, Feb. 2008, pp. 566-576.

(Continued)

*Primary Examiner* — Tony Ko
(74) *Attorney, Agent, or Firm* — Sughrue Mion, PLLC

(57) ABSTRACT

A data output device is provided. The data output device includes a converter circuit configured to generate a conversion signal based on an output signal; a boosting circuit configured to generate a boosting signal based on the output signal; and an output circuit configured to generate the output signal based on an input signal and a feedback signal, the feedback signal being based on the conversion signal and the boosting signal.

20 Claims, 16 Drawing Sheets

(56) References Cited

U.S. PATENT DOCUMENTS

| | | | |
|---|---|---|---|
| 2010/0019132 A1* | 1/2010 | Uo | H03F 1/30 |
| | | | 250/214 R |
| 2010/0020209 A1 | 1/2010 | Kim | |
| 2015/0319369 A1 | 11/2015 | Serrano Gotarredona et al. | |
| 2015/0380451 A1 | 12/2015 | Kurokawa | |
| 2016/0150174 A1 | 5/2016 | Hynececk | |

FOREIGN PATENT DOCUMENTS

| | | |
|---|---|---|
| JP | 2010-35168 A | 2/2010 |
| KR | 10-2015-0095841 A | 8/2015 |

OTHER PUBLICATIONS

Serrano-Gotarredona, et al., "A 128×128 1.5% Contrast Sensitivity 0.9% FPN 3μs Latency 4mW Asynchronous Frame-Free Dynamic Vision Sensor Using Transimpedance Preamplifiers", IEEE Journal of Solid-State Circuits, vol. 20, Issue No. 10, pp. 1-19.

Delbruck T. et al, Self-Biasing Low power adaptive photoreceptor, 2004, in Proc. IEEE, Vancouver, BC Canada, 2004, wol. 4, pp. 844-847 (Year: 2004).

\* cited by examiner

DATA OUTPUT DEVICE

CROSS-REFERENCE TO RELATED APPLICATIONS

This is a Continuation application of Ser. No. 15/436,108, filed Feb. 17, 2017, which claims priority from Korean Patent Application No. 10-2016-0110492, filed on Aug. 30, 2016 in the Korean Intellectual Property Office, the disclosures of which are incorporated herein by reference in their entireties.

BACKGROUND

1. Field

Methods and apparatuses consistent with example embodiments relate to outputting data.

2. Description of Related Art

A sensor including a plurality of elements may include a detecting element configured to detect a signal for each of the elements, an analog circuit configured to amplify the signal detected by the detecting element, and a digital circuit configured to process the amplified signal.

However, the sensing elements may be unable to detect an event, when the signal detected by the detecting element is relatively weak, and thus cannot be sufficiently amplified.

SUMMARY

Example embodiments may address at least the problem and/or disadvantage described above and other disadvantages not described above. Also, the example embodiments are not required to overcome the problem and/or disadvantage described above, and an example embodiment may not overcome the problem and/or disadvantage described above.

According to an aspect of an example embodiment, there is provided a data output device including: a converter circuit configured to generate a conversion signal based on an output signal; a boosting circuit configured to generate a boosting signal based on the output signal; and an output circuit configured to generate the output signal based on an input signal and a feedback signal, the feedback signal being based on the conversion signal and the boosting signal.

According to an aspect of another example embodiment, there is provided a sensing element including: an event detector including a photodiode and a converter, the photodiode being configured to generate a current signal corresponding to a change in an intensity of incident light and the converter being configured to convert the current signal to a voltage signal and amplify the voltage signal to generate an amplified voltage signal; and an event signal generator configured receive the amplified voltage signal from the event detector, generate an event signal corresponding to the amplified voltage signal and output the event signal to an output interface.

According to an aspect of yet another example embodiment, there is provided a method of generating a data output using a data output device including a converter circuit, a boosting and an output circuit, the method including: generating a conversion signal based on an output signal using the converter circuit; generating a boosting signal based on the output signal using the boosting circuit; and generating the output signal based on an input signal and a feedback signal, the feedback signal being based on the conversion signal and the boosting signal.

BRIEF DESCRIPTION OF THE DRAWINGS

The above and/or other aspects will be made more apparent by describing certain example embodiments with reference to the accompanying drawings, in which.

DETAILED DESCRIPTION

Figure 1:
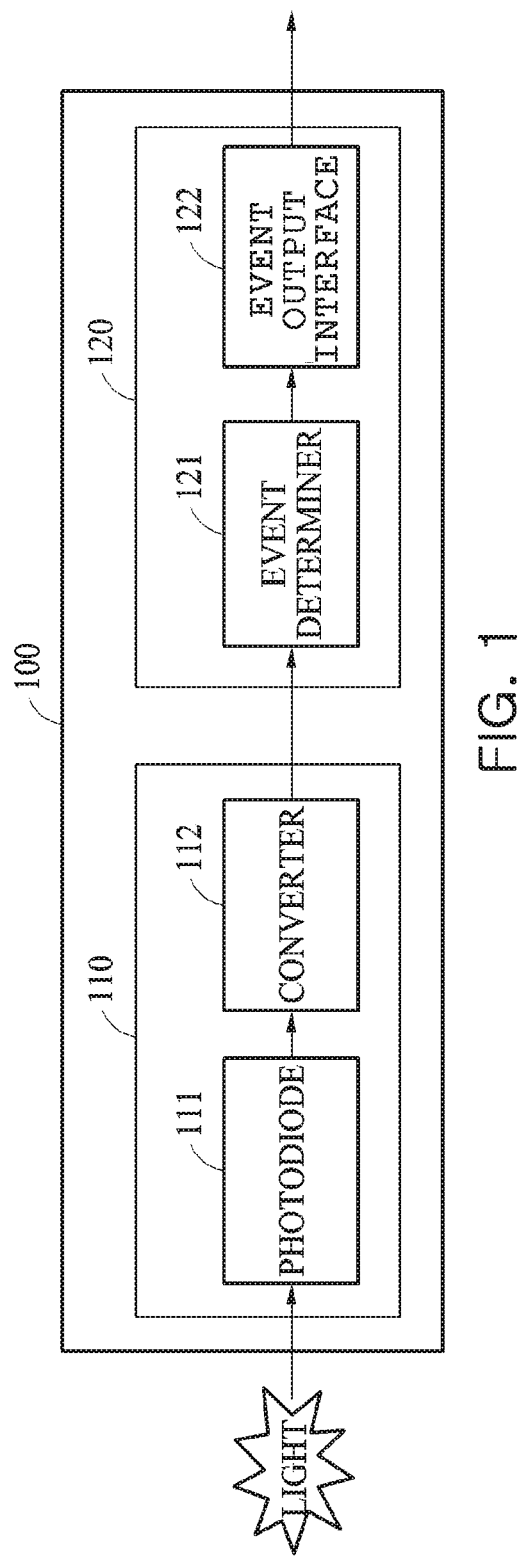
FIG. 1 is a block diagram illustrating a sensing element included in an event-based vision sensor according to an example embodiment.

Example embodiments are described in greater detail herein with reference to the accompanying drawings.

In the following description, like drawing reference numerals are used for like elements, even in different drawings. Various alterations and modifications may be made to the example embodiments, some of which will be illustrated in detail in the drawings and detailed description. The matters defined in the description, such as detailed construction and elements, are provided to assist in a comprehensive understanding of the example embodiments. However, it should be understood that these example embodiments are not limited to the illustrated forms and include all changes, equivalents or alternatives within the idea and the technical scope of this disclosure. It is apparent that the example embodiments can be practiced without those specifically defined matters. Also, well-known functions or constructions are not described in detail since they would obscure the description with unnecessary detail.

FIG. 1 is a block diagram illustrating a sensing element included in an event-based vision sensor according to an example embodiment.

The event-based vision sensor may include at least one sensing element 100. The sensing element 100 outputs an event signal in response to detecting an occurrence of a predetermined event.

According to an example embodiment, an event may include an event in which an intensity of light changes. For example, an event may be sensed using a vision sensor based on an event in which an external object is captured and an event signal may be output based on the sensed event.

The event-based vision sensor may asynchronously output an event signal in response to detecting a change in an intensity of incident light. For example, when an event in which an intensity of light increases is detected by the sensing element 100 in the event-based vision sensor, the sensing element 100 may output an ON event signal. When an event in which an intensity of light decreases is detected by the sensing element 100, the sensing element 100 may output an OFF event signal.

Unlike a frame-based vision sensor, an event-based vision sensor including a plurality of sensing elements 100, only the sensing elements 100 which detect a change of intensity of light may output an event signal, instead of scanning an output of a photodiode 111 of each pixel.

For example, when a light source is substantially fixed over a period of time, and when an external object does not self-emit light, light emitted from the light source and reflected by the external object may be incident on the event-based vision sensor. When the external object, the light source, and the event-based vision sensor do not move, light reflected by the stationary external object remains substantially unchanged and accordingly, an intensity of light incident on the event-based vision sensor may remain unchanged. In contrast, when the external object moves, light reflected by the moving external object changes as the external object moves, and accordingly, the intensity of the light incident on the event-based vision sensor may change.

An event signal output in response to a movement of an external object may be asynchronously generated information. For example, the event signal may be generated when a moving object, instead of a stationary object, is detected.

The above-described event-based vision sensor may utilize only time information and/or an address of the sensing element 100 at which an intensity of light changes, and thus an amount of information to be processed may be greatly reduced, in comparison to an amount of information to be processed by a typical image camera.

The sensing element 100 includes an event detector 110 and an event signal generator 120.

The event detector 110 generates an input signal in response to detecting an occurrence of an event. According to an example embodiment, the event detector 110 includes the photodiode 111 and a converter 112. The photodiode 111 outputs a current corresponding to a change in an intensity of received light, in response to the light being received. The converter 112 converts the current output from the photodiode 111 to a converted input signal in a form of a voltage. The event detector 110 amplifies the converted input signal and transmits the amplified input signal to the event signal generator 120.

The event detector 110 may be implemented as a data output device. Examples of the data output device will be described in detail below with reference to FIGS. 2 through 18.

The event signal generator 120 receives the amplified input signal from the event detector 110, processes the received amplified input signal, and generates an event signal corresponding to the amplified input signal. According to an example embodiment, the event signal generator 120 includes an event determiner 121 and an event output interface 122.

The event determiner 121 determines whether an event occurs, classifies the event according to a type of event among different types of events based on the amplified input signal, and generates the event signal corresponding to the event. For example, the event determiner 121 may determine whether an event occurs by comparing the amplified input signal received from the event detector 110 to a predetermined threshold. In response to determining the event is occurring, the event determiner 121 may determine a type of the event (for example, an ON event or an OFF event), and generate an event signal corresponding to the event. For example, the event determiner 121 may generate an event signal 1 corresponding to the ON event, and an event signal −1 corresponding to the OFF event.

The event output interface 122 outputs the event signal generated by the event determiner 121 and coordinates of a pixel in which a corresponding event occurs to an outside of a pixel array. For example, the event output interface 122 may output coordinates of a pixel in which an event occurs using an address event representation (AER) protocol. The AER protocol may be an asynchronous handshaking protocol used to transmit an event signal.

According to an example embodiment, a data output device may amplify an input signal such that a change of the input signal may be amplified, even when the change is relatively small. Thus, the data output device according an example embodiment may output an effectively enhanced gain using a relatively small number of transistors in a limited area. Structure of the data output device according to various example embodiments will be described below with reference to FIGS. 2 through 18.

Figure 2:
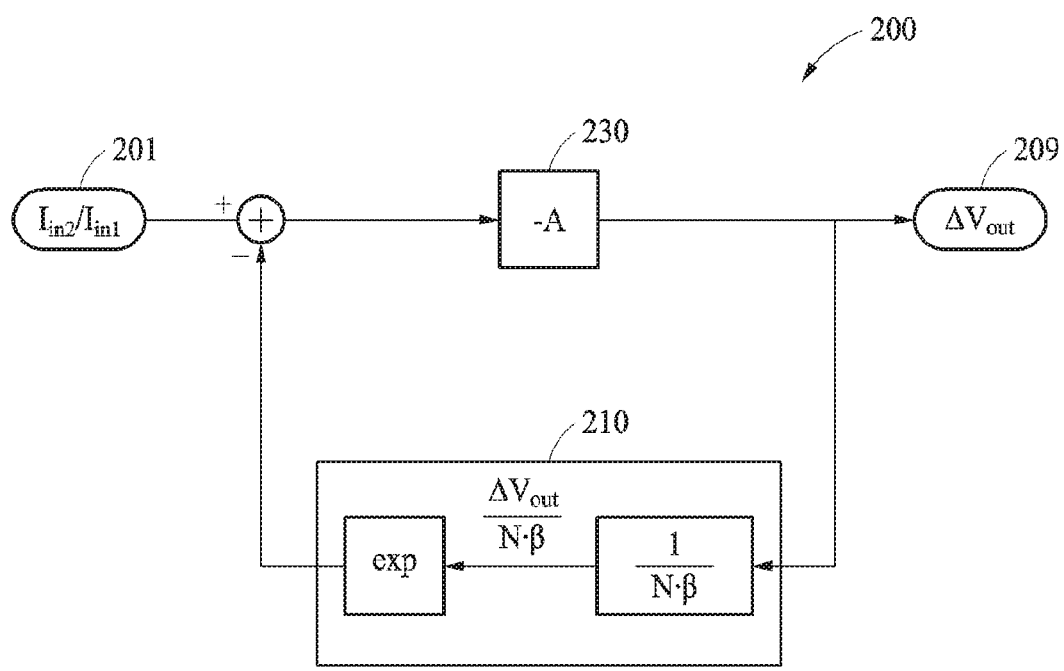
FIG. 2 is a diagram illustrating a data output device according to an example embodiment.

FIG. 2 is a diagram illustrating a data output device according to an example embodiment.

A data output device 200 may be a device configured to output a change amount of a predetermined value of an output signal 209 in response to a change of an input signal 201. For example, the data output device 200 outputs a change amount of a voltage, for example, an output voltage of an output signal, in response to a change of a current, for example, an input current of an input signal. As illustrated in FIG. 2, the data output device 200 receives $I_{in2}/I_{in1}$ as an input and outputs a voltage change $\Delta V_{out}$. Referring to FIG. 2, $I_{in1}$ denotes a magnitude of a current to be input to the data output device 200 at a first time, $I_{in2}$ denotes a magnitude of a current to be input to the data output device 200 at a second time subsequent to the first time, and $\Delta V_{out}$ denotes a voltage change of an output voltage occurring during a time between the first time and the second time. The data output device 200 outputs a change amount of the output voltage based on a change rate of the input current during a unit time in response to the occurrence of the event described with reference to FIG. 1.

The data output device 200 includes a feedback circuit 210 and an output circuit 230.

The feedback circuit 210 feeds the output signal 209 back to a front end of the output circuit 230. For example, the feedback circuit 210 generates a feedback signal of which a magnitude is proportional to an index of a change amount of a voltage of the output signal 209, and feeds the generated feedback signal back to the front end of the output circuit 230.

The feedback signal is a signal to be fed back to the front end of the output circuit 230 based on the output signal 209 and may be generated based on the output signal 209. The feedback circuit 210 may generate the feedback signal based on a boosting signal and a conversion signal. Examples of the boosting signal and the conversion signal will be described below with reference to FIG. 3.

According to an example embodiment, the magnitude of the current may correspond to a natural constant e having, as an index, a value obtained by multiplying $1/(N\beta)$ and the voltage change $\Delta V_{out}$ of the output signal 209. For example, the magnitude of the current of the feedback signal is expressed by $e^{\Delta V_{out}/(N\beta)}$. For example, the feedback circuit 210 may include a plurality of transistors, and N denotes a number of transistors stacked in the feedback circuit 210. $\beta$ denotes a value determined based on an operating temperature and a characteristic of each of the transistors. The number of the stacked transistors may indicate a number of transistors connected in series from an output node of the data output device 200 to an input node of the data output device 200. $\beta$ may be determined differently for each of the transistors. However, according to an example embodiment, $\beta$ of each of the stacked transistors may be an identical value, if characteristics of the transistors stacked in the feedback circuit 210 match. However, β is not limited thereto, and a value indicating a characteristic of a transistor may differ based on a design.

The output circuit 230 generates the output signal based on the input signal 201 and the feedback signal. According to an example embodiment, the output circuit 230 generates the output signal 209 based on the input signal 201 and the feedback signal based on the boosting signal and the conversion signal. For example, the output circuit 230 generates the output signal 209 by applying a gain of "-A" to a signal obtained by removing the feedback signal from the input signal 201. In this example, "A" is an ideal gain and indicates a sufficiently large value. For example, the output circuit 230 outputs the voltage change $\Delta V_{out}$ of the output signal 209 to be Nβ $(I_{in2}/I_{in1})$. Thus, the voltage change $\Delta V_{out}$ of the output signal 209 per unit time may be proportional to a value of a natural log ln of a change rate $I_{in2}/I_{in1}$ of a current of the input signal 201 per unit time.

Figure 3:
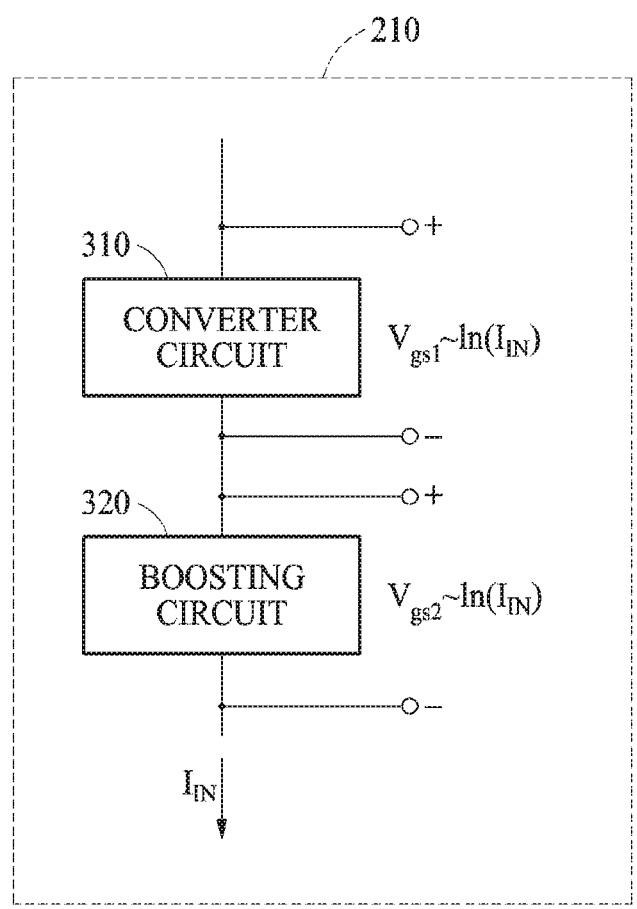
FIG. 3 is a diagram illustrating a feedback circuit according to an example embodiment.

FIG. 3 is a diagram illustrating a feedback circuit according to an example embodiment.

The feedback circuit 210 includes a converter circuit 310 and a boosting circuit 320.

The converter circuit 310 generates a conversion signal based on an output signal. According to an example embodiment, the conversion signal generated by the converter circuit 310 may have a current corresponding to an input current $I_{IN}$ and a converted voltage $V_{gs1}$ in proportion to a value of a natural log of the input current $I_{IN}$. For example, the converter circuit 310 may include a transistor operating in a sub-threshold region, and output, during an operation of the transistor, the converted voltage $V_{gs1}$, for example, a voltage of a conversion signal, of a conversion signal, corresponding to a magnitude in proportion to a log scale of the input current $I_{IN}$, in response to the input current $I_{IN}$ being received.

The boosting circuit 320 generates a boosting signal based on the output signal. According to an example embodiment, the boosting signal generated by the boosting circuit 320 may have the current corresponding to the input current $I_{IN}$ and a boosting voltage $V_{gs2}$ in proportion to the value of the natural log of the input current $I_{IN}$. For example, the boosting circuit 320 may include a transistor operating in the sub-threshold region, and output, during the operation of the transistor in the sub-threshold region, the boosting voltage $V_{gs2}$, for example, a voltage of a boosting signal, of the boosting signal corresponding to the magnitude in proportion to the log scale of the input current $I_{IN}$, in response to the input current $I_{IN}$ being received.

The sub-threshold region may indicate a region in which a voltage between a gate node and a source node of a transistor is smaller than a threshold voltage. Currents on the order of femtoamperes (fAs) and nanoamperes (nAs) may pass through the transistor operating in the sub-threshold region. Transistors included in each of the converter circuit 310 and the boosting circuit 320 may be designed to operate in the sub-threshold region.

Stacked transistors included in the feedback circuit 210 may be transistors that output at least a portion of an output voltage. According to an example embodiment, a number of the stacked transistors may be determined based on a number of the transistors included in the converter circuit 310 and a number of the transistors included in the boosting circuit 320. For example, the number of the transistors stacked in the feedback circuit 210 may correspond to a sum of the number of the transistors included in the converter circuit 310 and the number of the transistors included in the boosting circuit 320. However, the number of the transistors is not limited thereto, and the feedback circuit 210 may include additional transistors other than the stacked transistors.

Examples of the converter circuit 310 and the boosting circuit 320 will be described below.

FIGS. 4 through 7 are circuit diagrams illustrating a boosting circuit according to one or more example embodiments.

Figure 4:
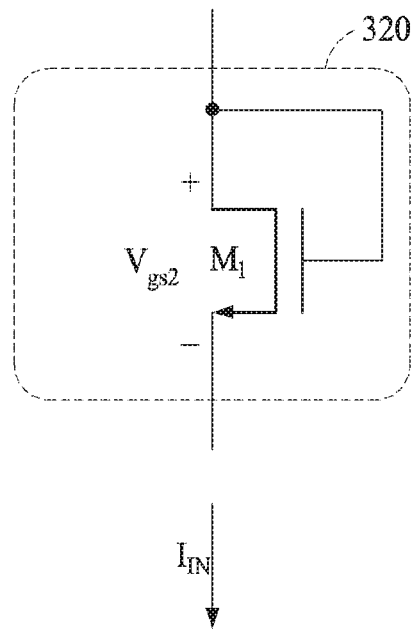
FIGS. 4 through 7 are circuit diagrams illustrating a boosting circuit according to one or more example embodiments.
Figure 6:
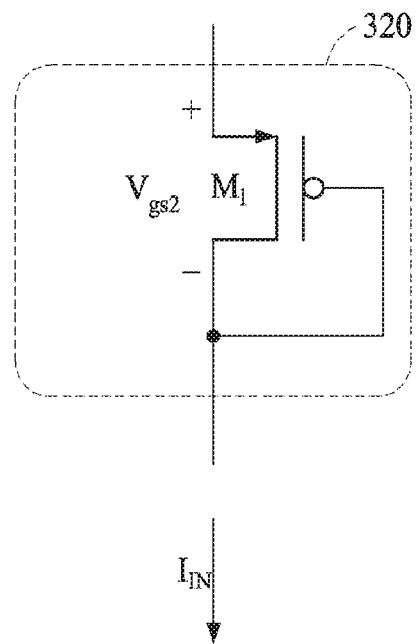
Figure 7:
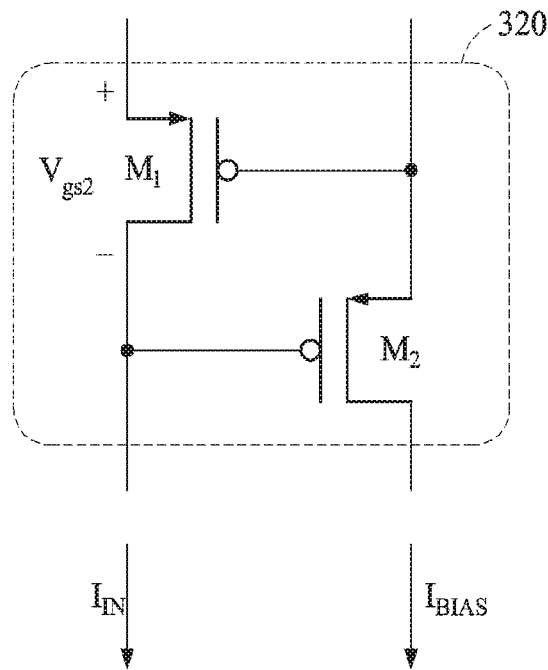

The boosting circuit 320 of FIG. 4 includes a transistor $M_1$ in which a drain node and a gate node are connected to each other. As described above, the transistor $M_1$ included in the boosting circuit 320 may operate in a sub-threshold region, and generate the boosting voltage $V_{gs2}$ based on the input current $I_{IN}$. The boosting voltage $V_{gs2}$ may indicate a voltage between the gate node and a source node of the transistor $M_1$ included in the boosting circuit 320. FIG. 4 illustrates that the boosting circuit 320 is a circuit including an n-channel metal oxide semiconductor (NMOS) transistor, but the boosting circuit 320 is not limited thereto. The boosting circuit 320 may include a p-channel metal oxide semiconductor (PMOS) transistor as illustrated in FIG. 6. The boosting circuit 320 of FIG. 6 has a structure in which the PMOS transistor is replaced with the NMOS transistor of FIG. 4, so that the boosting circuit 320 of FIG. 6 performs the same operation of the boosting circuit 320 of FIG. 4.

Figure 5:
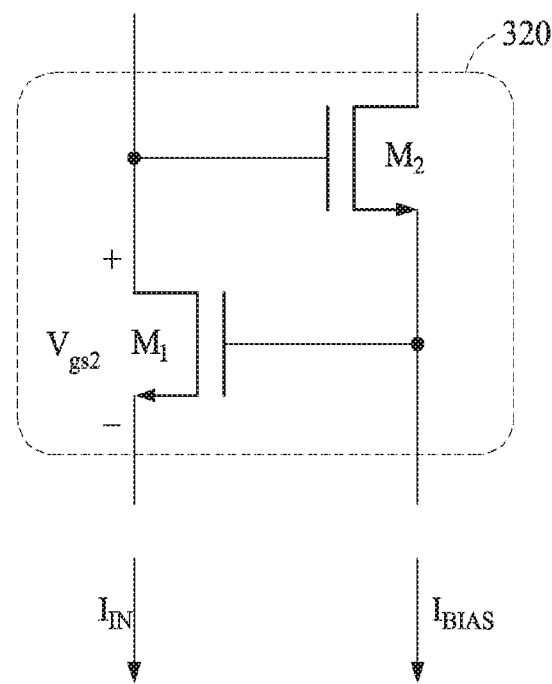

The boosting circuit 320 of FIG. 5 includes the first transistor $M_1$ and a second transistor $M_2$. The first transistor $M_1$ includes a gate node connected to a source node of the second transistor $M_2$, and a drain node connected to a gate node of the second transistor $M_2$. The second transistor $M_2$ includes the source node connected to the gate node of the first transistor $M_1$ and the gate node connected to the drain node of the first transistor $M_1$. The second transistor $M_2$ may operate based on a bias current $I_{BIAS}$, and the first transistor $M_1$ may operate based on the input current $I_{IN}$. FIG. 5 illustrates a circuit including the first transistor $M_1$ and the second transistor $M_2$ both of which are NMOS transistors. The boosting circuit 320 of FIG. 7 has a structure in which the PMOS transistor is replaced with the NMOS transistor of FIG. 5, so that the boosting circuit 320 of FIG. 7 performs the same operation as the boosting circuit 320 of FIG. 5.

The boosting circuit 320 of FIGS. 4 through 7 may output the boosting voltage $V_{gs2}$ in proportion to the number of the stacked transistors even in a relatively limited area.

FIGS. 8 through 18 are circuit diagrams illustrating a data output device according to one or more example embodiments.

Figure 8:
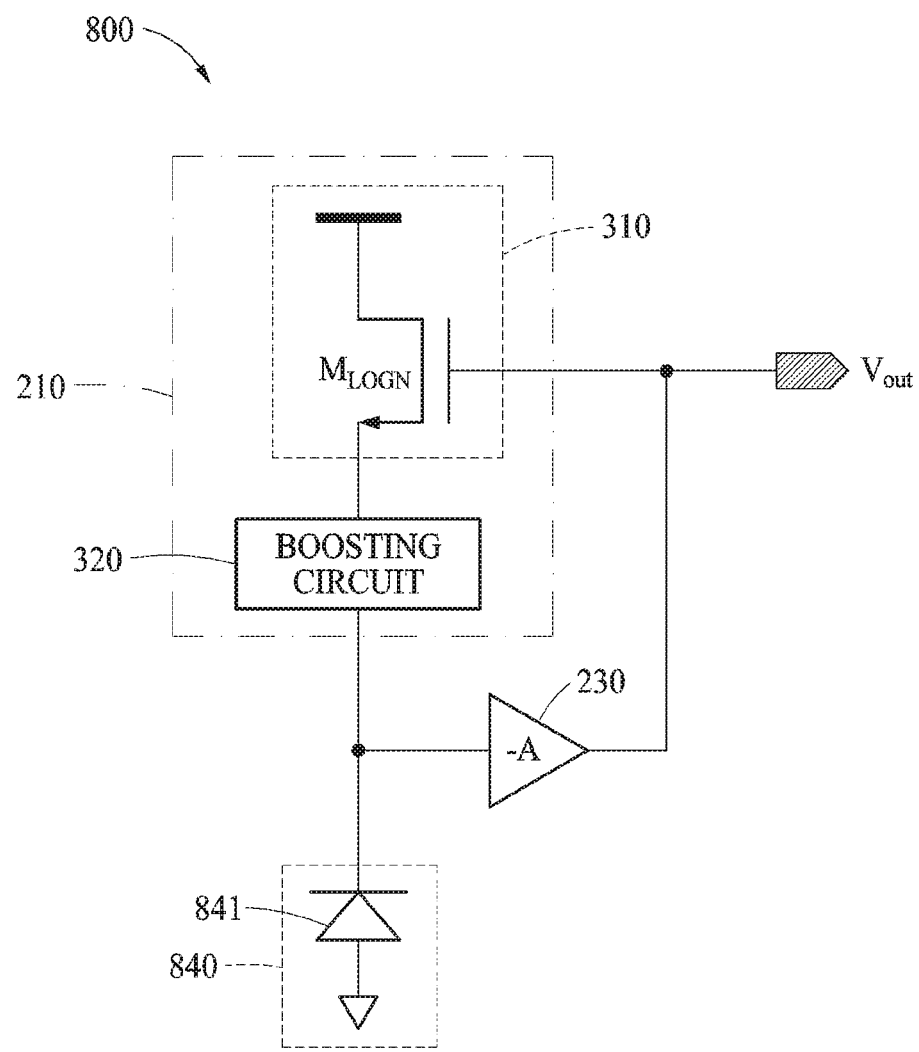
FIGS. 8 through 18 are circuit diagrams illustrating a data output device according to one or more example embodiments.

FIG. 8 illustrates a data output device 800 including a photo element 840, the feedback circuit 210, and the output circuit 230 according to an example embodiment. The converter circuit 310 of FIG. 8 may be a source follower circuit.

One end of the output circuit 230 may be connected to one end of the photo element 840 and one end of the feedback circuit 210. Another end of the output circuit 230 may be connected to another end of the feedback circuit 210 and an output node $V_{OUT}$.

Although not illustrated in FIG. 8, the output circuit 230 of the data output device 800 may further include a change output circuit to output a change amount of a voltage of an output signal corresponding to a change rate of a current of an input signal. For example, the change output circuit may extract a change amount of a voltage by removing a direct current (DC) component from an output voltage.

The photo element 840 may generate the input signal based on an external light. For example, the photo element 840 may include a photodiode 841 to generate an input current of the input signal in proportion to an intensity of the external light in response to the external light being received.

The output circuit 230 may generate the output signal obtained by amplifying a feedback signal using a gain of "−A", as illustrated in FIG. 8. For example, the output circuit 230 includes a transistor including a gate node connected to one of the boosting circuit 320 and the converter circuit 310, a source node connected to a ground, and a drain node to generate the output voltage. The output circuit 230 may be applicable to all structures illustrated in FIGS. 2 through 18.

According to an example embodiment, the feedback circuit 210 includes the converter circuit 310 to directly receive the output signal and the boosting circuit 320 connected to the converter circuit 310.

The converter circuit 310 includes a transistor $M_{LOGN}$ including a gate node to receive the output voltage of the output signal and a source node to output a converted voltage of a conversion signal based on the output voltage. Although FIG. 8 illustrates that the transistor $M_{LOGN}$ is an NMOS transistor, the transistor $M_{LOGN}$ is not limited thereto. The transistor $M_{LOGN}$ may be replaced with a PMOS transistor. The converter circuit 310 may output the converted voltage in proportion to a value of a natural log of an input voltage.

The boosting circuit 320 may output the converted voltage in proportion to the value of the natural log of the input voltage. The converted voltage may indicate a voltage of the conversion signal.

According to an example embodiment, the data output device 800 may have a structure in which m transistors are stacked in the boosting circuit 320. Here, m may be an integer greater than or equal to "1". When the boosting circuit 320 includes m stacked transistors, the data output device 800 may output the voltage change $\Delta V_{out}$ of the output signal to be $(m+1)\beta \ln (I_{in2}/I_{in1})$. $I_{in2}$ and $I_{in1}$ may indicate a magnitude of each current generated at a second time and a first time. Here, the current is generated by the photodiode 841.

Figure 9:
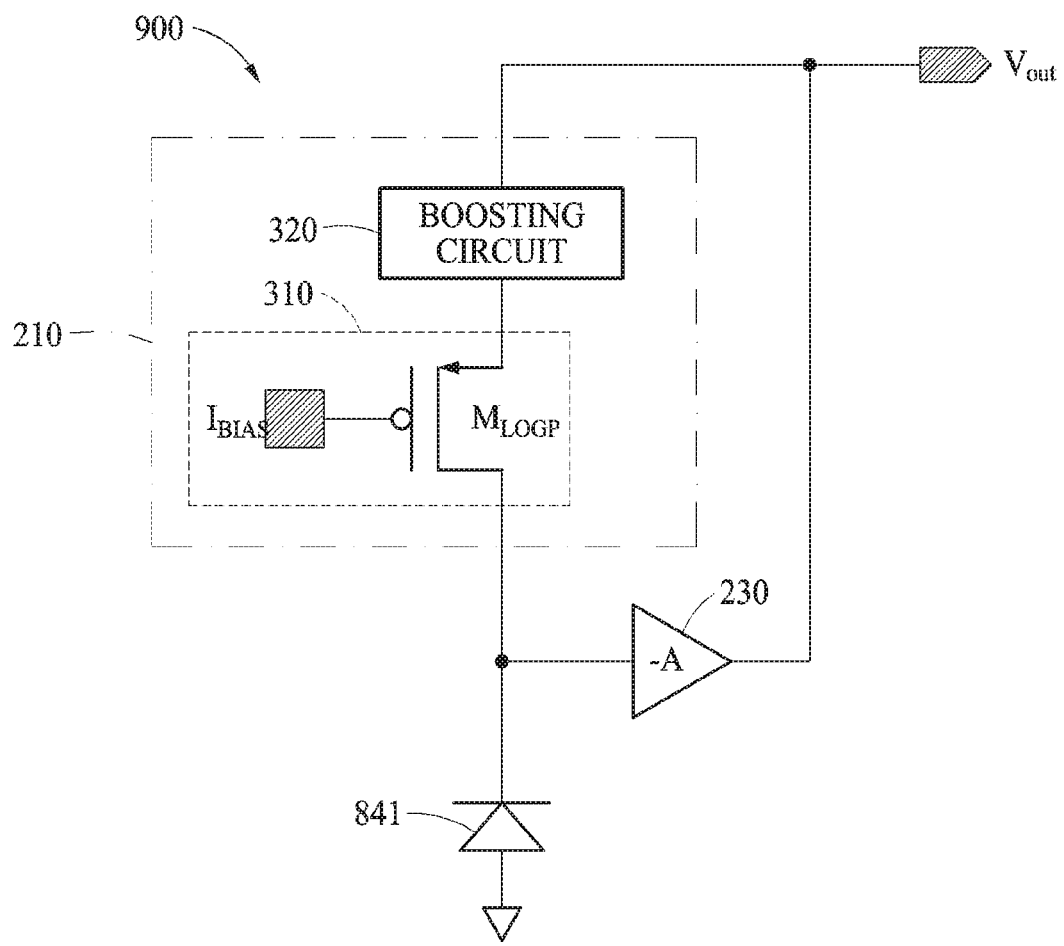

FIG. 9 illustrates a data output device 900 including the boosting circuit 320 directly connected to the output circuit 230, according to an example embodiment. The converter circuit 310 may be a common gate amplifier circuit.

For example, one end of the output circuit 230 may be connected to one end the photodiode 841 and one end of the converter circuit 310. Another end of the output circuit 230 may be connected to the boosting circuit 320 and the output node $V_{OUT}$. According to an example embodiment, one end of the boosting circuit 320 may receive an output signal, and another end of the boosting circuit 320 may be connected to the converter circuit 310. The converter circuit 310 includes a transistor $M_{LOGP}$ including a source node connected to another end of the boosting circuit 320, a gate node connected to a bias supply $V_{BIAS}$, and a drain node connected to the photodiode 841 and the output circuit 230.

According to an example embodiment, the data output device 900 of FIG. 9 may have a structure in which m transistors are stacked in the boosting circuit 320. When the boosting circuit 320 includes m stacked transistors, the data output device 900 may output a voltage change $\Delta V_{out}$ of the output signal to be $(m+1)\beta \ln (I_{in2}/I_{in1})$.

Figure 10:
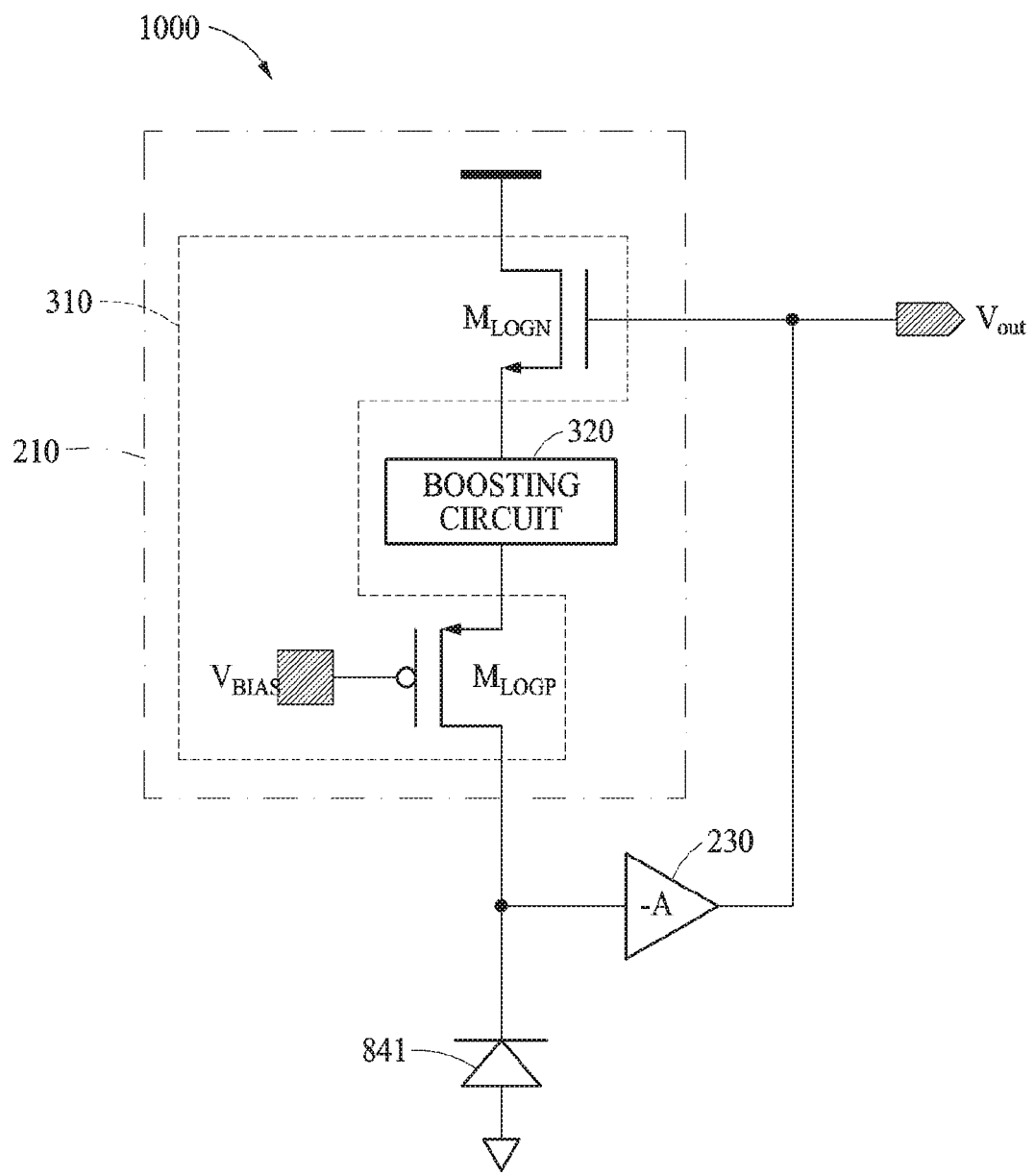

FIG. 10 illustrates a data output device 1000 according to an example embodiment. As shown in FIG. 10, the data output device may have a structure in which the converter circuit 310 is connected to each end of the boosting circuit 320.

According to an example embodiment, the converter circuit 310 may include a first transistor $M_{LOGN}$ including a gate node to receive an output voltage and a source node connected to one end of the boosting circuit 320, and a second transistor $M_{LOGP}$ including a source node connected to another end of the boosting circuit 320 and a drain node connected to the output circuit 230. The gate node of the second transistor $M_{LOGP}$ may be connected to a bias supply $V_{BIAS}$. Although FIG. 10 illustrates that the first transistor $M_{LOGN}$ is an NMOS transistor and the second transistor $M_{LOGP}$ is a PMOS transistor, the first transistor $M_{LOGN}$ and the second transistor $M_{LOGP}$ are not limited thereto. Positions of the first transistor $M_{LOGN}$ and the second transistor $M_{LOGP}$ may be changed.

According to an example embodiment, the data output device 1000 of FIG. 10 may have a structure in which m transistors are stacked in the boosting circuit 320. When the boosting circuit 320 includes m stacked transistors, the data output device 1000 outputs a voltage change $\Delta V_{out}$ of an output signal to be $(m+2)\beta \ln (I_{in2}/I_{in1})$.

Figure 11:
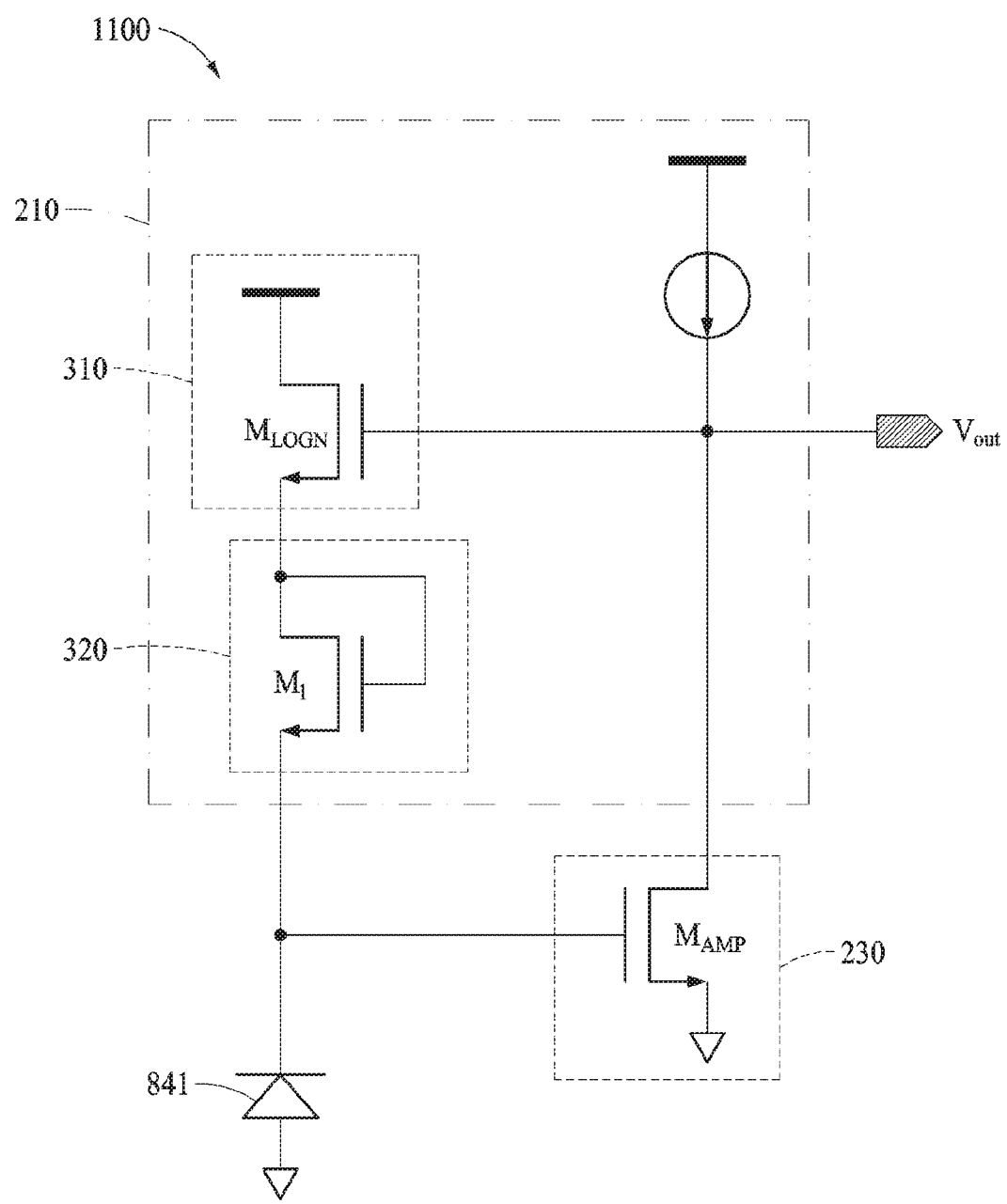

FIG. 11 illustrates a data output device according to an example embodiment. As illustrated in FIG. 11, the data output device 1100 has a structure illustrated in FIG. 8, and includes the boosting circuit 320 illustrated in FIG. 4. The data output device 1100 further includes a current source to supply a bias current to the output device 230. However, the data output device 1100 is not limited thereto. The data output device 1100 may include the boosting circuit 320 illustrated in FIG. 6 instead of the boosting circuit 320 illustrated in FIG. 4.

According to an example embodiment, the data output device 1100 of FIG. 11 outputs a voltage change $\Delta V_{out}$ of an output signal to be $2\beta \ln (I_{in2}/I_{in1})$.

Figure 12:
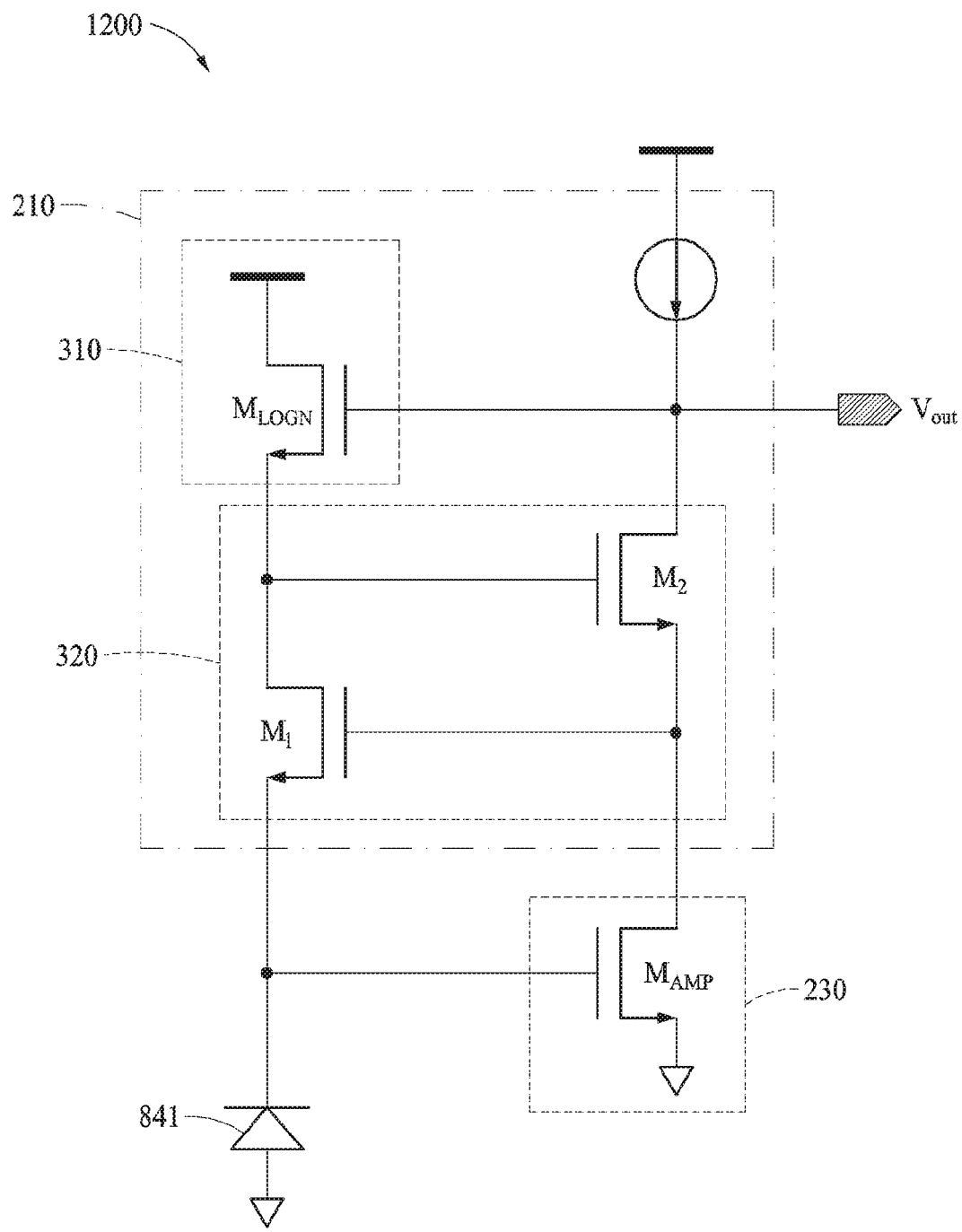

FIG. 12 illustrates a data output device 1200 having a structure illustrated in FIG. 8, and includes the boosting circuit 320 illustrated in FIG. 5, according to an example embodiment. The data output device 1200 may further include a current source to supply a bias current to the output circuit 230. However, the data output device 1200 is not limited thereto. The data output device 1200 may include the boosting circuit 320 illustrated in FIG. 7 instead of the boosting circuit 320 illustrated in FIG. 5.

According to an example embodiment, the converter circuit 310 illustrated in FIG. 12 may include a third transistor $M_{LOGN}$ including a source node connected to a gate node of a second transistor $M_2$ and a drain node of a first transistor $M_1$, and a gate node to receive an output signal.

According to an example embodiment, the data output device 1200 outputs a voltage change $\Delta V_{out}$ of an output signal to be $2\beta \ln (I_{in2}/I_{in1})$. Because two transistors are stacked (N=2), two transistors are connected in series in a path from an output node Vout to an input node corresponding to the photodiode 841.

Further, the output circuit 230 illustrated in FIGS. 11 and 12 may include an amplifier transistor $M_{AMP}$ including a gate node to receive an input signal, a source node connected to a ground, and a drain node to generate an output signal.

Figure 13:
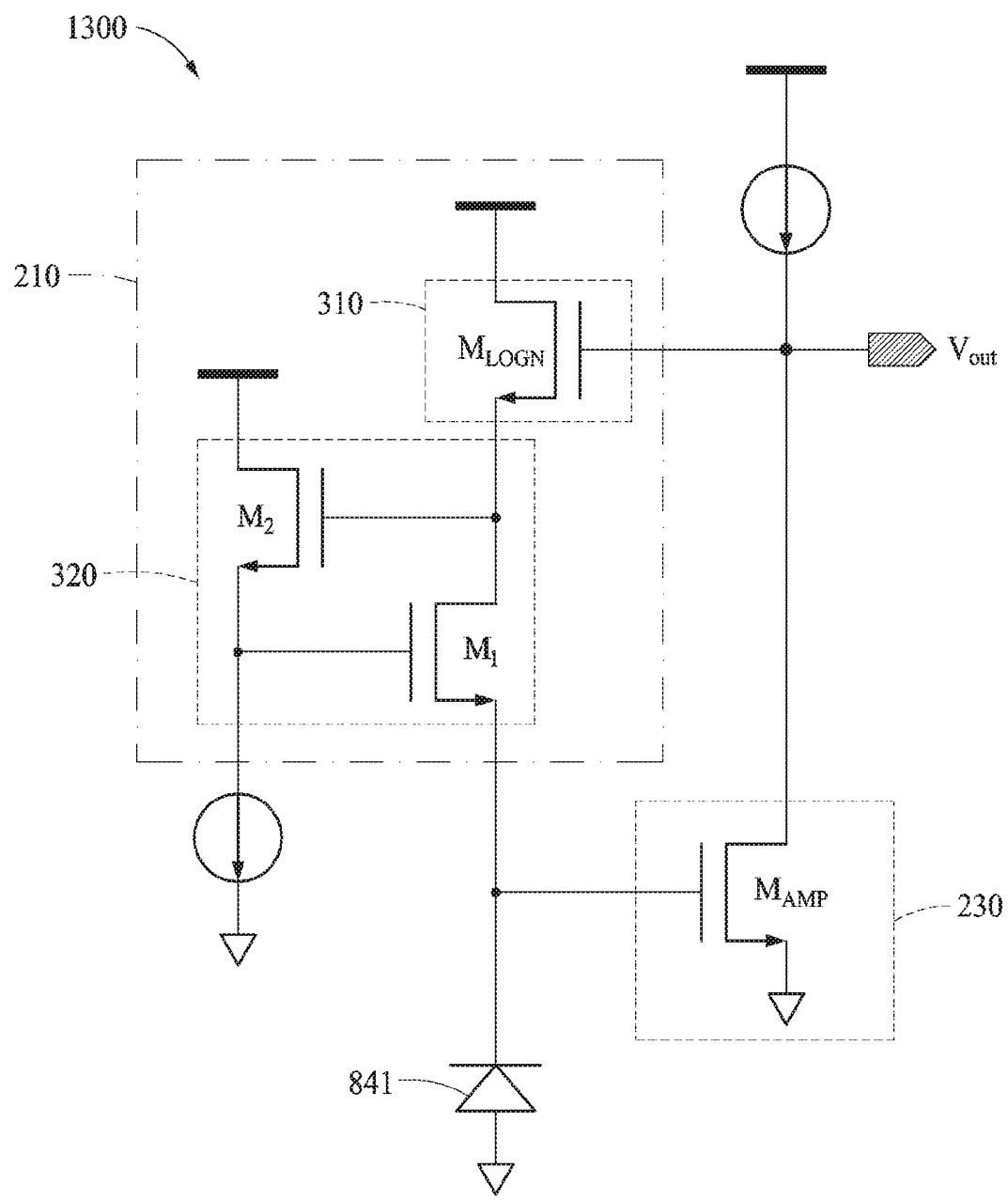

FIG. 13 illustrates a data output device according to another example embodiment. As shown in FIG. 13, a data output device 1300 has a structure illustrated in FIG. 8, and includes the boosting circuit 320 illustrated in FIG. 5. However, unlike the drain node illustrated in FIG. 12, a drain node of a second transistor $M_2$ illustrated in FIG. 13 may be connected to a power supply, and a source node may be connected to a current source and a gate node of a first transistor $M_1$.

According to an example embodiment, the output circuit 230 may include an amplifier transistor including a gate node connected to a source node of the first transistor $M_1$, a source node connected to a ground, and a drain node to generate an output voltage. The data output device 1300 may further include the current source connected to the gate node of the first transistor $M_1$ and a source node of the second transistor $M_2$.

According to an example embodiment, the data output device 1300 of FIG. 13 may output a voltage change $\Delta V_{out}$ of an output signal to be $2\beta \ln (I_{in2}/I_{in1})$.

Figure 14:
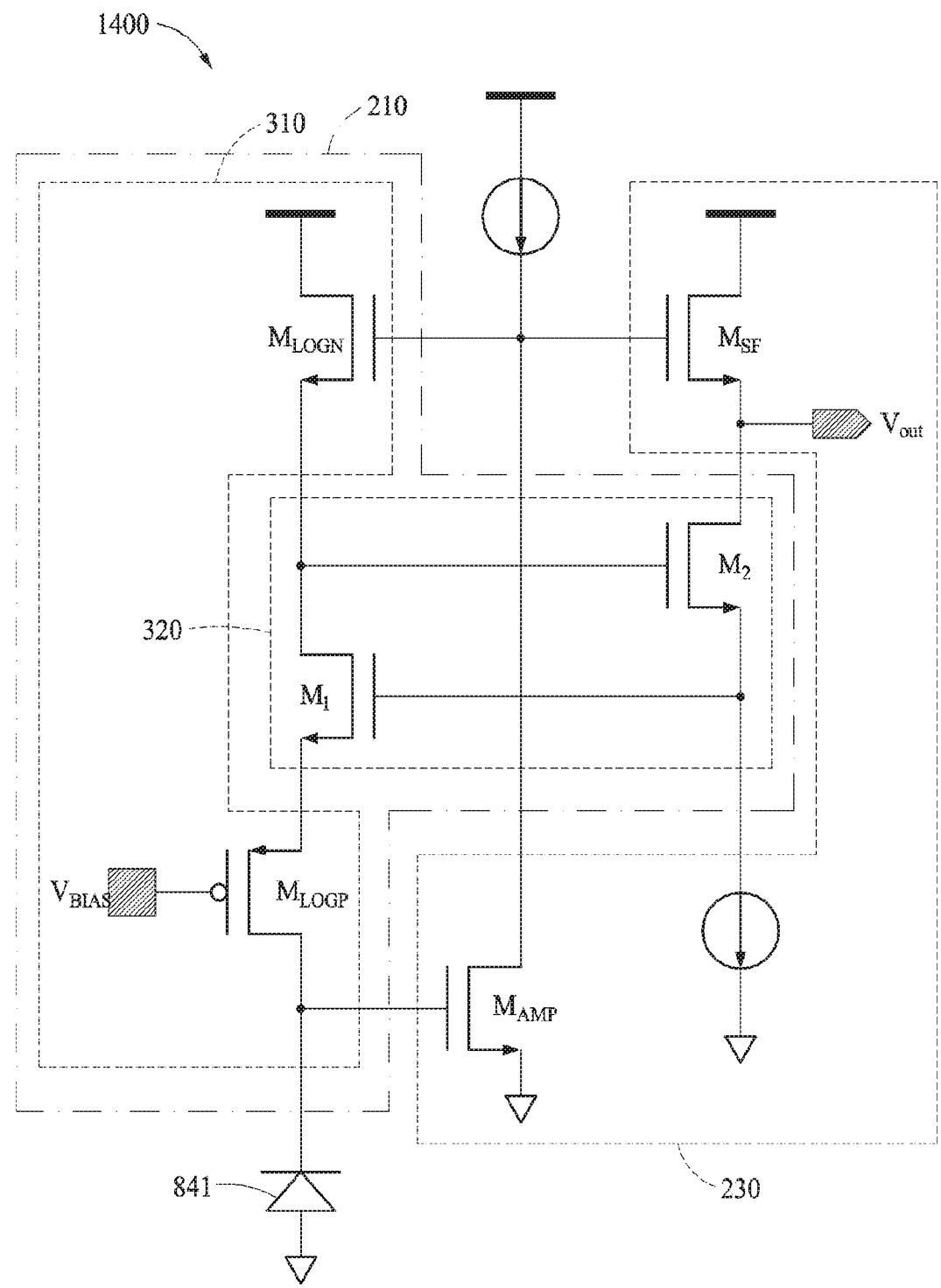

A data output device 1400 of FIG. 14, according to an example embodiment, includes the converter circuit 310 illustrated in FIG. 10 and the boosting circuit 320 illustrated in FIG. 5. For example, the data output device 1400 may include a circuit in which the boosting circuit 320 provided in a source follower circuit is connected to the converter circuit 310 by a cascade type connection.

According to an example embodiment illustrated in FIG. 14, the converter circuit 310 may include an NMOS transistor $M_{LOGN}$ and a PMOS transistor $M_{LOGP}$. The NMOS transistor $M_{LOGN}$ included in the converter circuit 310 may include a source node connected to a drain node of a first transistor $M_1$ and a gate node of a second transistor $M_2$, and a gate node connected to one end of the output circuit 230. The PMOS transistor $M_{LOGP}$ included in the converter circuit 310 may include a source node connected to a source node of the first transistor $M_1$ and a drain node connected to another end of the output circuit 230. A gate node of the PMOS transistor $M_{LOGP}$ may be connected to a bias supply $V_{BIAS}$.

The output circuit 230 illustrated in FIG. 14 may include an output transistor $M_{SF}$ including a gate node corresponding to one end of the output circuit 230 and a source node to generate an output voltage, and an amplifier transistor $M_{AMP}$ including a gate node corresponding to another node of the output circuit 230. Here, the gate node corresponding to another end of the output circuit 230 may receive an input current. The input current may be generated by the photodiode 841.

The data output device 1400 may include a current source that supplies a current to the amplifier transistor $M_{AMP}$ and a current source that supplies a current to the output transistor $M_{SF}$.

According to an example embodiment, the data output device 1400 of FIG. 14 may output a voltage change $\Delta V_{out}$ of an output signal to be $2\beta \ln (I_{in2}/I_{in1})$.

Figure 15:
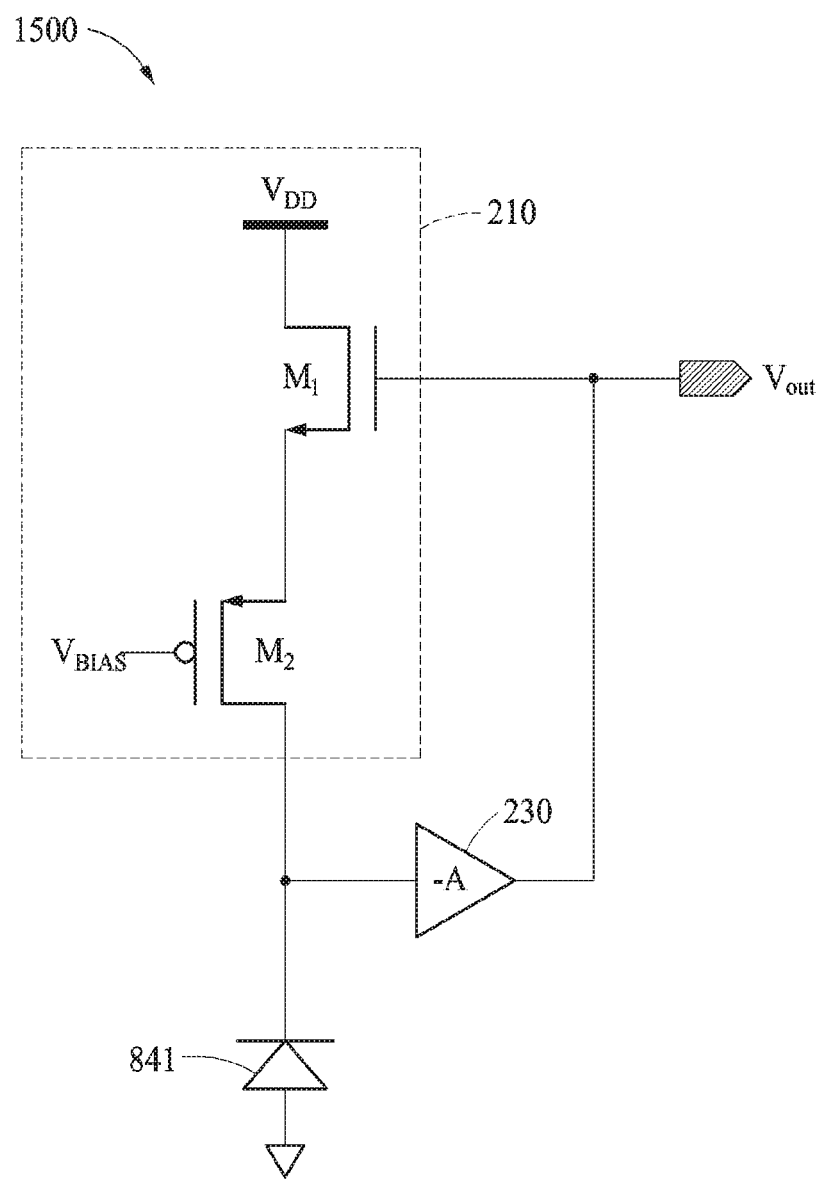
Figure 16:
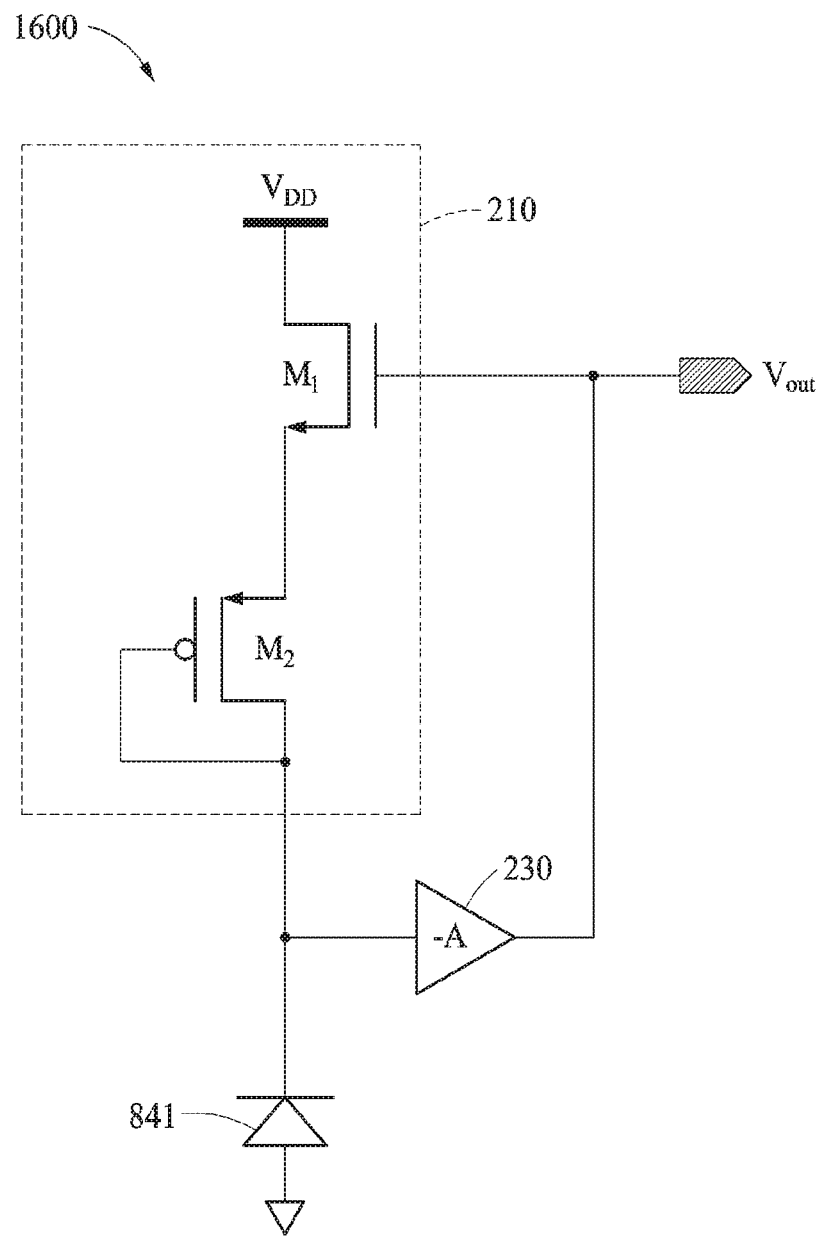

FIG. 15 illustrates a feedback circuit according to an example embodiment. As illustrated, a data output device 1500 includes feedback circuit 210, which includes the boosting circuit 320 and the converter circuit 310. According to an example embodiment, at least one of a plurality of transistors included in the feedback circuit 210 may operate as the converter circuit 310 or the boosting circuit 320 for remaining transistors. For example, when at least one of the transistors included in the feedback circuit 210 is the converter circuit 310, remaining transistors may operate as the boosting circuit 320 for the transistor included in the feedback circuit 210. Further, the converter circuit 310 and the boosting circuit 320 may have identical circuit structures.

According to an example embodiment, one of the converter circuit 310 and the boosting circuit 320 may include a first transistor $M_1$ including a source node connected to a source node of a second transistor $M_2$ and a gate node to receive an output signal. The other one of the converter circuit 310 and the boosting circuit 320 may include the second transistor $M_2$ including the source node connected to the source node of the first transistor $M_1$ and a drain node connected to the output circuit 230.

Figure 17:
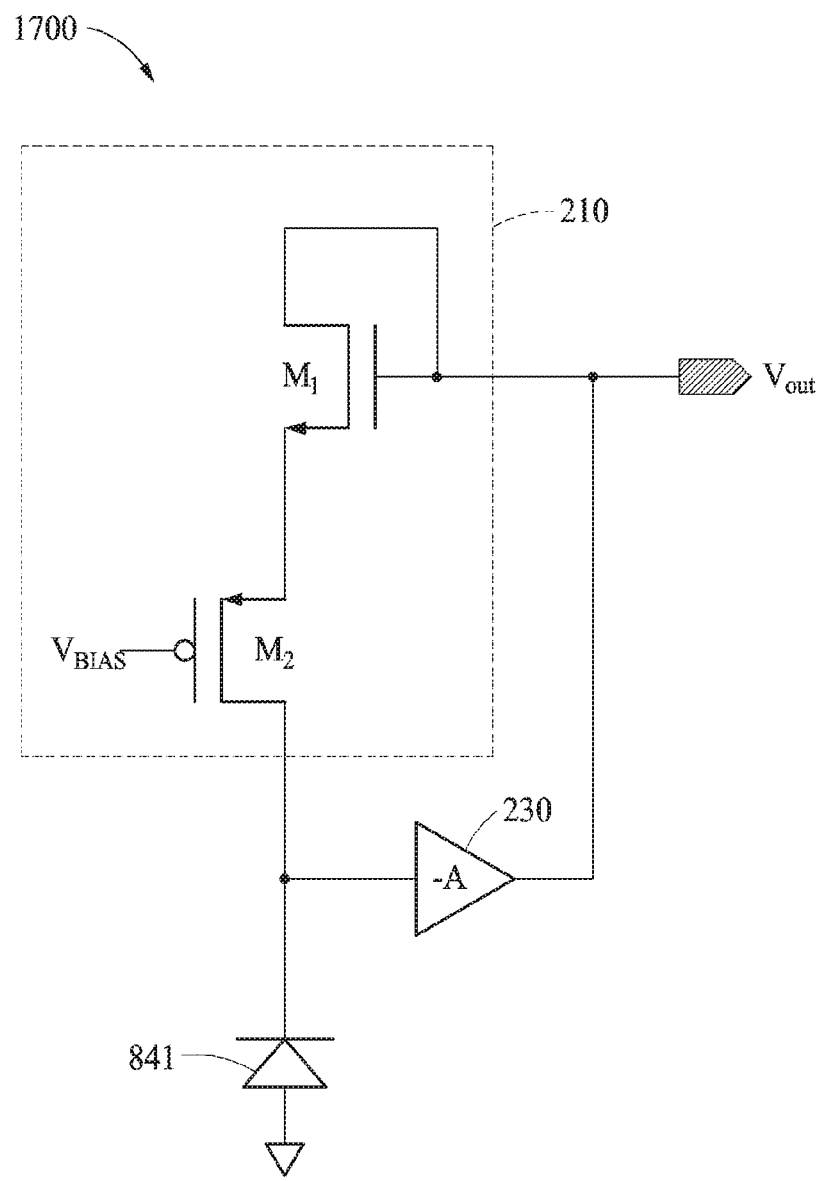
Figure 18:
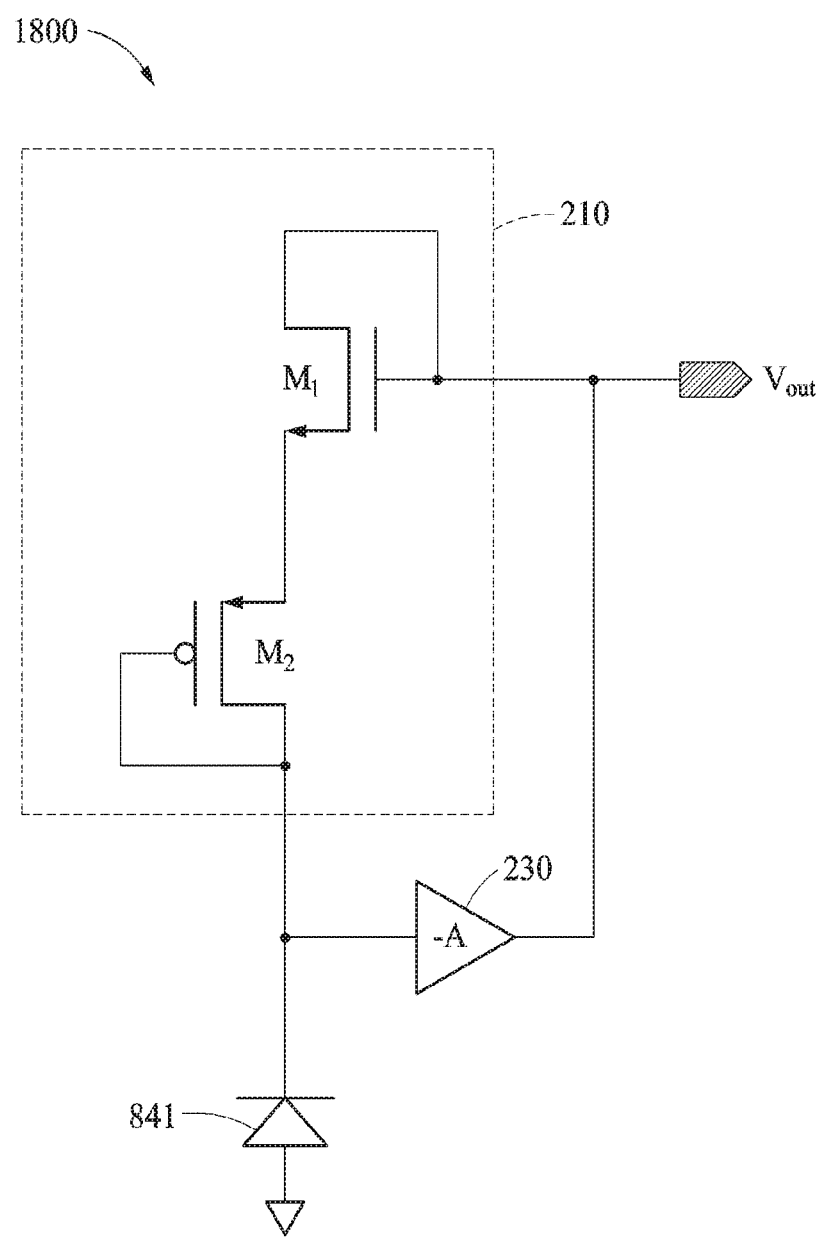

According to an example embodiment, at least one of the converter circuit 310 and the boosting circuit 320 may include a transistor in which a drain node and a gate note are connected to each other. For example, a gate node and a drain node of a second transistor $M_2$ may be connected to each other in a data output device 1600 of FIG. 16. As illustrated in FIGS. 17 and 18, a gate node and a drain node of a first transistor $M_1$ may be connected to each other.

According to an example embodiment, a data output device 1700 of FIG. 17 and a data output device 1800 of FIG. 18, the converter circuit 310 may include a transistor $M_1$ including a gate node to receive an output voltage, a drain node to receive the output voltage, and a source node to output a converted voltage of a conversion signal based on the output voltage. Although an upper portion of the feedback circuit 210 is described as the converter circuit 310, the upper portion of the feedback circuit 210 is not limited thereto. The upper portion of the feedback circuit 210 may operate as the boosting circuit 320, and a lower portion of the feedback circuit 210 may operate as the converter circuit 310.

According to various example embodiments, each of the data output devices 1500, 1600, 1700, and 1800, as illustrated in FIGS. 15 through 18, may output a voltage change $\Delta V_{out}$ of the output signal to be $2\beta \ln (I_{in2}/I_{in1})$.

A data output device according to an example embodiment may effectively increase a current-voltage gain under a circumstance where a number of transistors to be stacked in a design area is limited and a size of the design area is limited in an event-based vision sensor. For example, without the boosting circuit 320, a required area all necessary transistors may be excessively increased or a structure in which a large number of the transistors are stacked may be required in order to output a voltage change $\Delta V_{out}$ of an output signal to be $2\beta \ln (I_{in2}/I_{in1})$. However, according to an example embodiment, because a number of transistors of each of the data output devices 1100, 1500, 1600, 1700, and 1800 is two (N=2), each of the data output devices 1100, 1500, 1600, 1700, and 1800 may output the voltage change $\Delta V_{out}$ of the output signal to be $2\beta \ln (I_{in2}/I_{in1})$ even when two transistors are included in the feedback circuit 210.

For each of the transistors illustrated in FIGS. 3 through 18, the transistor may be an NMOS transistor or a PMOS transistor, but is not limited thereto, and a circuit may be changed based on a transistor type.

As is traditional in the field, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the present disclosure. Further, the blocks, units and/or modules of the example embodiments may be physically combined into more complex blocks, units and/or modules without departing from the scope of the present disclosure.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A data output device comprising:
   an output circuit configured to generate an output signal based on an input signal received from a first node and a feedback signal;
   a current source connected to a second node for outputting the output signal, and configured to supply a bias current to the output circuit;
   a converter circuit including at least one transistor connected to the second node, and configured to generate a conversion signal based on the output signal; and
   a boosting circuit including at least one transistor connected between the first node and the second node, and configured to generate the feedback signal based on the conversion signal.

2. The data output device of claim 1, wherein the output circuit comprises an amplifying transistor, and
   a gate node of the amplifying transistor is connected to the first node and a source node of the amplifying transistor is connected to a ground.

3. The data output device of claim 1, wherein the input signal comprises a light signal generated by a photo element.

4. The data output device of claim 3, wherein the output circuit generates the output signal by removing the feedback signal from the input signal.

5. The data output device of claim 1, wherein the boosting circuit generates the feedback signal by amplifying the conversion signal, based on the number of transistors connected in series from the first node to the second node.

6. The data output device of claim 1, wherein the converter circuit comprises a converting transistor, and
   a gate node of the converting transistor receives the output signal and a drain node of the converting transistor is connected to a bias supply.

7. The data output device of claim 1, wherein the converter circuit generates the conversion signal by log-scaling a change rate of the input signal, during an operation of the converter circuit in a sub-threshold region.

8. The data output device of claim 1, wherein the boosting circuit comprises a first transistor and a second transistor,
   a drain node of the first transistor receives the conversion signal and a source node of the first transistor is connected to the first node, and
   a drain node of the second transistor is connected to the second node and a source node of the second transistor is connected to the output circuit.

9. The data output device of claim 8, wherein the first transistor and the second transistor comprise an n-channel metal oxide semiconductor (NMOS) transistor,
   a gate node of the first transistor is connected to a source node of the second transistor.

10. The data output device of claim 8, wherein the first transistor and the second transistor comprise a p-channel metal oxide semiconductor (PMOS) transistor,
    a gate node of the first transistor is connected to a drain node of the second transistor.

11. The data output device of claim 1, wherein the boosting circuit generates the feedback signal by amplifying the conversion signal based on the number of the at least one transistor provided in the boosting circuit, during an operation of the boosting circuit in a sub-threshold region.

12. A data output device comprising:
    a converter circuit configured to generate a conversion signal based on a first output signal;
    a boosting circuit configured to generate a boosting signal based on the first output signal,
    wherein the boosting circuit comprises a first transistor and a second transistor,
    a gate node of the first transistor is connected to a source node of the second transistor, and
    a gate node of the second transistor is connected to a drain node of the first transistor;
    an output circuit configured to generate a second output signal based on a feedback signal and an input signal, the feedback signal being based on the conversion signal and the boosting signal, the input signal output from an output node of a photo element,
    wherein the output circuit comprises an amplifying transistor connected between the second transistor and a ground,
    a gate node of the amplifying transistor is connected to the output node of the photo element.

13. The data output device of claim 12, wherein the second output signal is fed back to the converter circuit as the first output signal.

14. The data output device of claim 12, wherein the converter circuit comprises a third transistor connected between a power voltage and the first transistor,
    a gate node of the third transistor receives the first output signal.

15. The data output device of claim 12, wherein the feedback signal has a magnitude which is proportional to a change in a voltage of the first output signal.

16. The data output device of claim 12, wherein the output circuit generates the second output signal by removing the feedback signal from the input signal.

17. The data output device of claim 12, wherein the drain node of the first transistor is connected to the converter circuit,
    a source node of the first transistor is connected to the output node of the photo element,
    a drain node of the second transistor is connected to a output node for outputting the first and second output signals, and
    the source node of the second transistor is connected to the ground.

18. The data output device of claim 12, wherein a source node of the first transistor is connected to the converter circuit, the drain node of the first transistor is connected to the output node of the photo element, the source node of the second transistor is connected to an output node for outputting the first and second output signals, and a drain node of the second transistor is connected to the ground.

19. A sensing element comprising:

an event detector comprising a photodiode and a plurality of transistors, the photodiode being configured to generate an input signal corresponding to a change in an intensity of incident light, wherein the event detector is configured to generate a first output signal based on the input signal received from an input node, amplify the first output signal to generate a feedback signal, generate a second output signal based on the input signal and the feedback signal, and output the second output signal via an output node; and an event signal generator configured to generate an event signal corresponding to the second output signal, and output the event signal to an output interface, wherein the event detector is configured to generate the feedback signal by amplifying the first output signal based on the number of transistors connected in series from the input node to the output node.

20. The sensing element of claim 19, wherein the event detector comprises a converter circuit and a boosting circuit, the converter circuit generates a conversion signal by performing a current-voltage conversion of the input signal, and the boosting circuit generates the feedback signal based on the conversion signal.

* * * * *